United States Patent [19]

Bono et al.

[11] 4,338,548
[45] Jul. 6, 1982

[54] UNIPOTENTIAL LENS ASSEMBLY FOR CHARGED PARTICLE BEAM TUBES AND METHOD FOR APPLYING CORRECTION POTENTIALS THERETO

[75] Inventors: David C. Bono, Melrose; Marvin Fishbein, Brookline; Kenneth J. Harte, Carlisle, all of Mass.

[73] Assignee: Control Data Corporation, Minneapolis, Minn.

[21] Appl. No.: 116,895

[22] Filed: Jan. 30, 1980

[51] Int. Cl.³ .................................................. H01J 29/58
[52] U.S. Cl. .................................................. 315/382
[58] Field of Search ................... 315/382, 31 R, 370, 315/409

[56] References Cited

U.S. PATENT DOCUMENTS 4,142,132 2/1979 Harte .................................. 315/370

Primary Examiner—Theodore M. Blum
Attorney, Agent, or Firm—Charles W. Helzer

[57] ABSTRACT

A unipotential electrostatic lens and method of operation for charged particle beam tubes of the electron beam, compound fly's eye type having both coarse and fine deflection sections wherein the objective lens assembly may lack coaxial symmetry about the lens axis. The unipotential lens comprises an assembly of axially aligned electrostatic lens elements with each lens element having an array of micro lenslet apertures and with each set of axially aligned micro lenslet apertures forming a micro lenslet. Preferably, there are three such lens elements in the assembly with a high voltage excitation potential supplied to the center lens element. A dynamic focus correction potential derived from the deflection potentials applied to the tube is supplied to the entrance outer lens element closest to the electron gun of the beam tube. The remaining outer lens element is maintained at system ground reference potential. In preferred arrangements, a fixed offset potential is added to the high voltage excitation potential supplied to the center lens element and a compensating offset potential is supplied to the entrance outer lens element along with the dynamic focusing correction potential to thereby distribute and minimize the effect of deflection sweep and astigmatism errors which otherwise might be introduced by the uncompensated dynamic focus correction potential.

24 Claims, 7 Drawing Figures

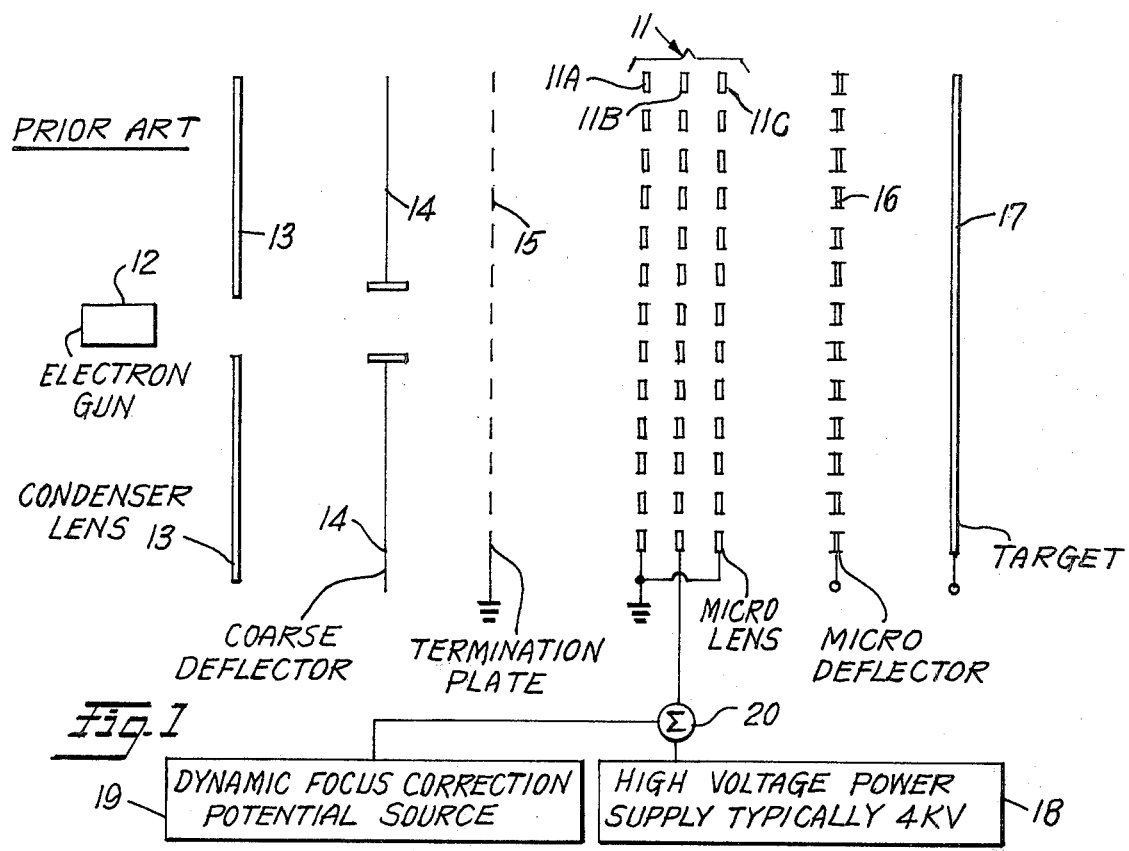
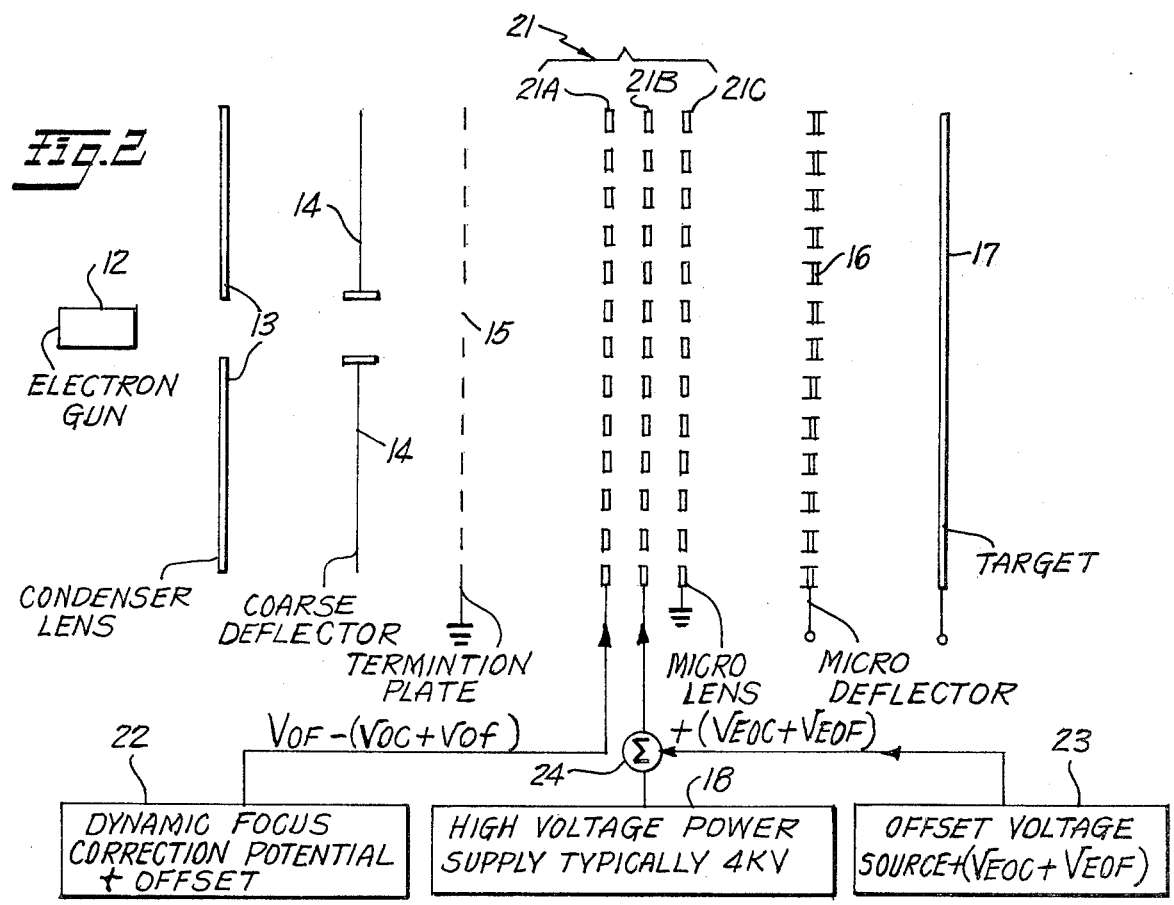

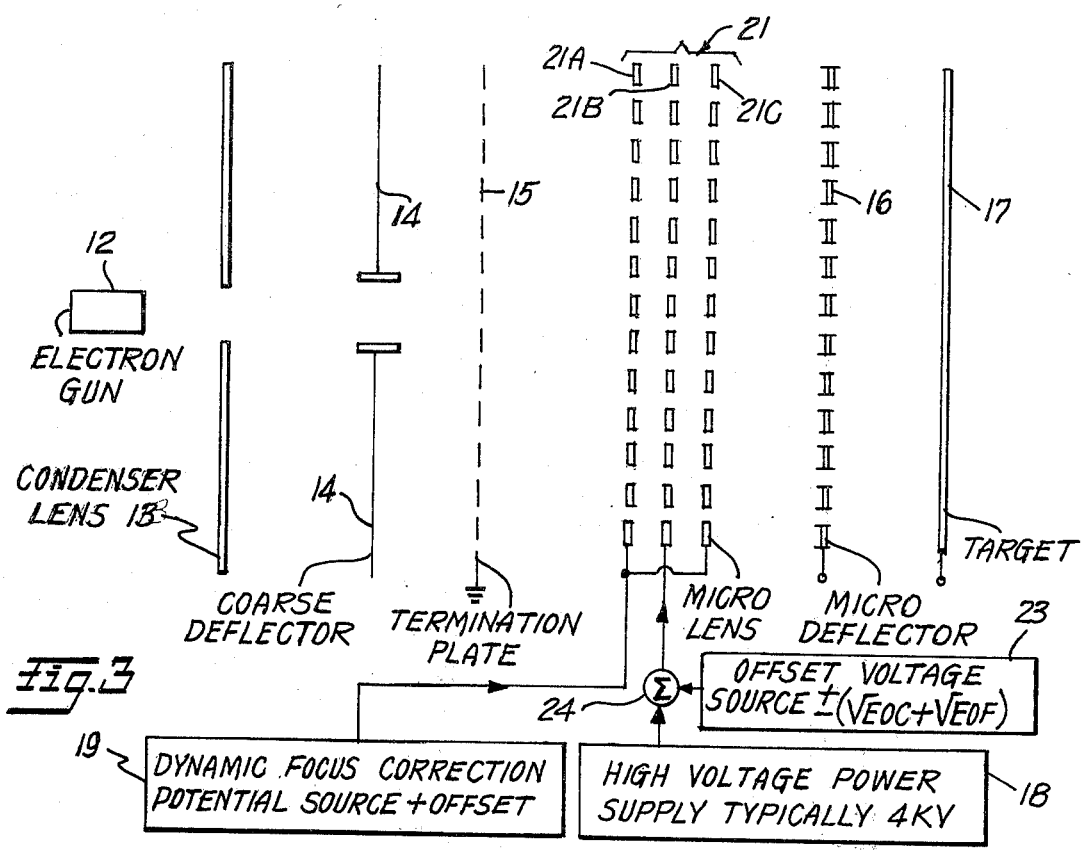
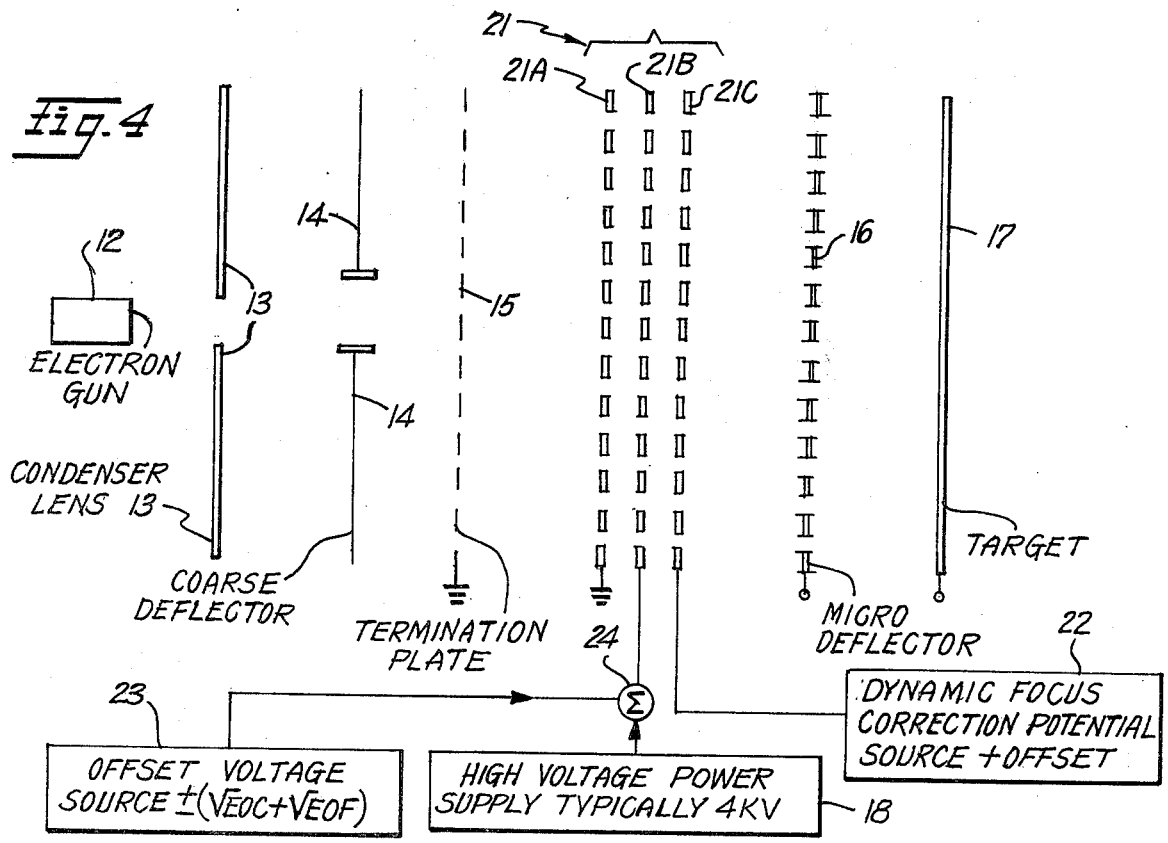

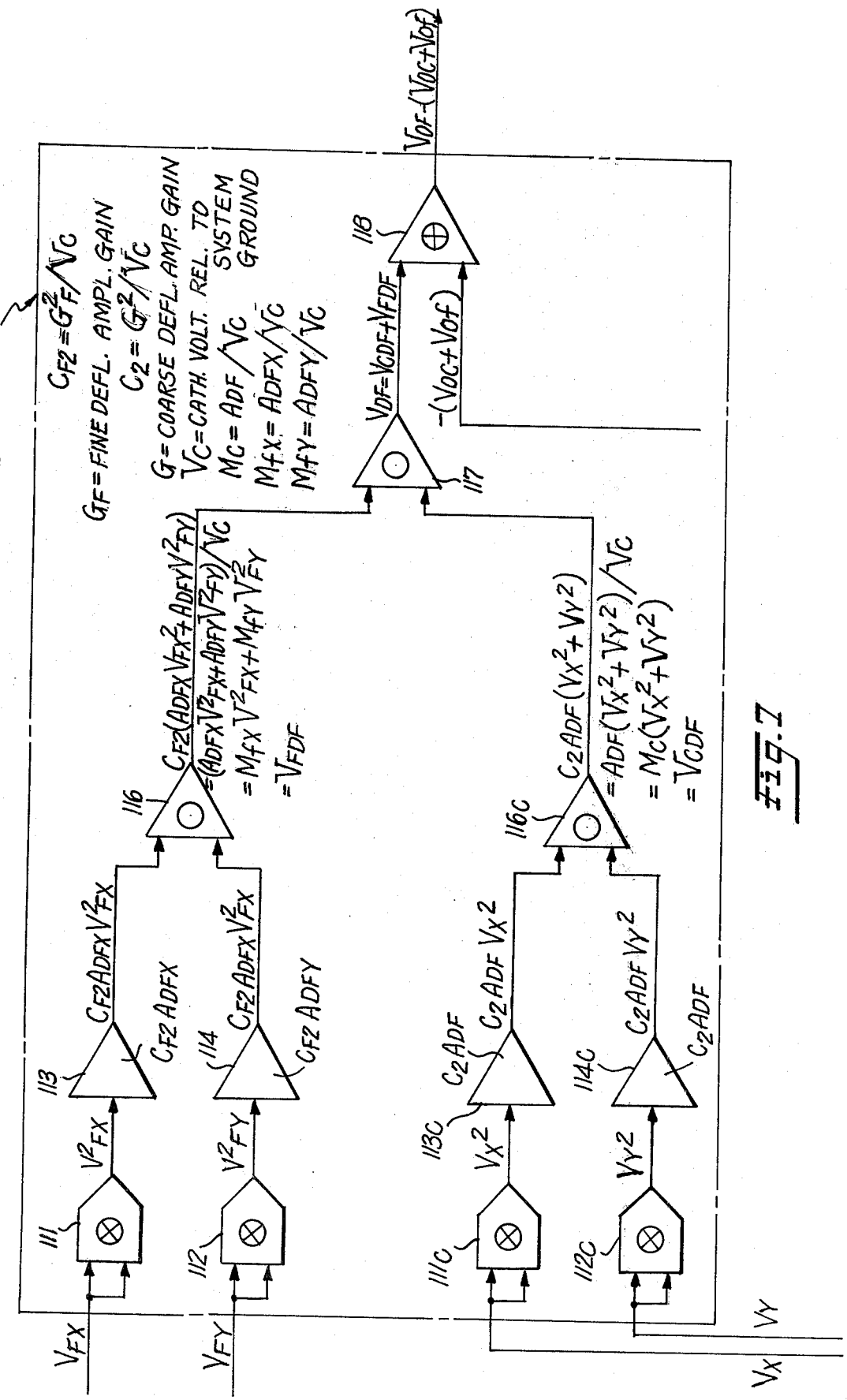

UNIPOTENTIAL LENS ASSEMBLY FOR CHARGED PARTICLE BEAM TUBES AND METHOD FOR APPLYING CORRECTION POTENTIALS THERETO

FIELD OF INVENTION

This invention relates to charged particle beam tubes of the electron beam tube type and in particular to such tubes useable in electron beam accessible memories for computers (EBAMS) and/or electron beam accessible lithography continuously evacuated demountable columns (EBALS) employed in the fabrication of large scale integrated micro circuits and the like.

More specifically, the invention is directed to an improved unipotential objective lens assembly preferably used in a compound fly's eye type electron beam tube or demountable column having both coarse deflection and fine deflection sections for simplifying construction, maintenance and operation of such tubes or demountable columns and reducing their cost while at the same time reducing and minimizing electron beam aberrations and astigmatism at the target plane.

BACKGROUND PROBLEM

U.S. Pat. No. 4,142,132, issued Feb. 27, 1979 entitled "Method and Means for Dynamic Correction of Electrostatic Deflector for Electron Beam Tube"—Kenneth J. Harte, inventor and assigned to the Control Data Corporation describes a new method and means for dynamic correction and minimization of aberrations produced in the electron beam of electron beam tubes employing electrostatic deflection systems. In U.S. Pat. No. 4,142,132, a preferred construction of a compound, fly's eye type electron beam tube employing an eight-fold coarse deflector, an objective lens of the fly's eye type employing a number of micro lenslets and a micro deflector, is described together with the method and means for providing correction electric potentials to the eight-fold deflector member for minimizing aberrations of the electron beam spot at the target plane. In addition, U.S. Pat. No. 4,142,132 describes a method and means for deriving a dynamically corrected focus potential from the fine X and Y deflection voltages and applying the dynamically corrected focus potential to the objective lens of the compound electron beam tube. In a copending United States patent application Ser. No. 093,008, filed Nov. 9, 1979, entitled "Beam Tube Having Electrostatic Eight-Fold Double Deflection System with Coarse Deflection Dynamic Focus and Diverging Beam"—Kenneth J. Harte and Edward C. Dougherty, an improved dynamic focus correction system is described which employs components of both the coarse and fine deflection potentials in deriving the dynamically corrected focus potential to be applied to the objective lens of the compound electron beam tube. The disclosures of both U.S. Pat. No. 4,142,132 and copending application Ser. No. 093,008 are incorporated into the disclosure of this application in their entirety.

The EBAM tube systems described and claimed in each of the above noted prior art disclosure employ a classical Einzel lens as the objective lens assembly, as will be discussed more fully hereinafter in connection with FIG. 1 of the drawings. To achieve focus of an electron beam using a classical Einzel lens assembly it is necessary to apply a high voltage energizing potential (typically 4 kilovolts) to the center element of the standard three elements lens as shown in FIG. 1. However, in order to maintain focus of a deflected electron beam on a stationary target plane, it is further necessary to apply a dynamic correction to the focus voltage so that the focal plane of the lens will fall as closely as possible onto the target plane. For applications requiring rapid changes in order to supply such dynamic correction as illustrated in FIG. 1, it is very difficult and expensive to implement circuitry which will rapidly change and very precisely regulate a high voltage power supply. With the arrangement shown in FIG. 1, it is necessary that the high voltage power supply provide a high voltage energizing potential of typically four kilovolts (4 kv) and it is necessary to superimpose upon this high energizing potential a dynamic fine focus correction potential of say ±30 to 100 volts and to provide the dynamically corrected focus potential through an amplifier having a typical band width of 1 megahertz. The provision of such circuitry is at best difficult to both build and maintain in operation as well as expensive.

The electronic drive problem discussed in the preceding paragraph has been overcome in the present invention by applying the dynamic component of the focus voltage to a separate entrance lens element rather than to a common center element as will be described more fully hereinafter with respect to the remaining Figures of the drawings.

SUMMARY OF THE INVENTION

It is therefore a primary object of the invention to provide a relatively simple, low cost and reliable method and means for applying the dynamic component of a dynamically corrected focus voltage supplied to an objective lens assembly which may be used in EBAM and/or EBAL tubes and demountable columns of the compound fly's eye type having both coarse and fine deflection sections.

Another object of the invention is to provide such an improved objective lens micro assembly and EBAM/EBAL tubes or demountable columns employing such assemblies while at the same time reducing to a minimum electron beam aberrations and electron beam astigmatism at the target plane.

In practicing the invention, a new and improved objective lens assembly and method of operation thereof is described for charged particle tubes of the compound fly's eye electron beam type, which may lack coaxial symmetry about the tube axis. The objective lens assembly comprises a plurality of electrostatic lens elements axially aligned along the charged particle electron beam path with each lens element having an array of micro lenslet apertures formed therein and with each set of axially aligned micro lenslet apertures forming a micro lenslet. In a preferred construction there are three lens elements comprising the micro lenslet assembly with one of the outermost electrostatic lens elements being maintained at system ground reference potential level. Means are provided for applying a high voltage excitation potential to the inner electrostatic lens element which is located between and bounded by two outer lens elements, one of which is maintained at system ground reference potential level as noted earlier. A dynamic focus correction potential derived from the deflection potentials supplied to both the coarse and fine deflection sections of the tube, is supplied to the remaining outer electrostatic lens element.

In addition to the above, the preferred embodiment of the invention has a fixed offset potential added to the high voltage excitation potential and a compensating offset potential added to the dynamic focus correction potential in order to distribute and minimize the effect of deflection sweep and astigmatism errors that otherwise might be introduced by the uncompensated dynamic focus correction potential alone.

BRIEF DESCRIPTION OF DRAWINGS

These and other objects, features and many of the attendant advantages of this invention will be appreciated more readily as the same becomes better understood from a reading of the following detailed description when considered in connection with the accompanying drawings, wherein like parts in each of the several figures are identified by the same reference character, and wherein:

FIG. 1 is a partial schematic diagram illustrating the major parts of a prior art EBAM or EBAL tube or demountable column of the compound, fly's eye type employing both coarse and fine deflection sections, and illustrates a known construction and method of operation of the objective micro lens assembly used in such known system;

FIG. 2 is a partial schematic diagram that is in many respects similar to FIG. 1 but which illustrates a preferred objective lens micro assembly constructed and operated according to the invention;

FIG. 3 illustrates an alternative system and method for operating a three element objective micro lens assembly in accordance with the invention;

FIG. 4 illustrates another alternative system and method for operating a three element objective micro lens assembly in accordance with the invention;

FIG. 7 is a functional block diagram of a dynamic focus correction potential generator circuit illustrating the manner in which a dynamic focus correction potential together with required offset voltage is derived for use in practicing the invention.

DETAILED DESCRIPTION OF PREFERRED EMBODIMENT

Figure 6:
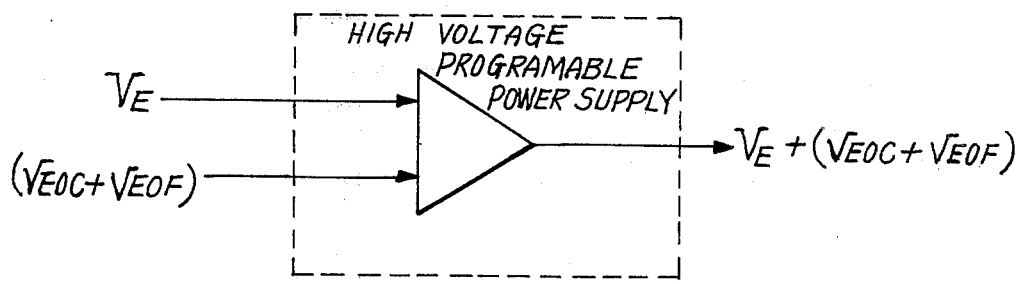
FIG. 6 is a simplified functional block diagram of a programmable high voltage power supply suitable for use in practicing the invention.

In order to focus a charged particle beam such as an electron beam using a classical, electrostatic three element Einzel lens such as that shown at 11 in FIG. 1, one has to supply a high voltage energization potential, typically about 4 kilovolts, to the center lens element 11B of a three plate lens assembly 11. Assembly 11 is comprised of two outer lens elements 11A and 11C and the inner lens element 11B to which the high voltage supply potential is connected. The two outer lens elements 11A and 11C normally are connected together and maintained at system ground reference potential as shown in FIG. 1. The illustration in FIG. 1 is of a typical objective micro lens assembly employed in a compound, fly's eye electron beam tube having both a coarse deflection system 14 and a fine deflection system 16 on opposite sides of lens assembly 11. Assembly 11 consists of three axially aligned lens elements 11A, 11B and 11C with each lens element having an array of micro lenslet apertures formed therein and with the micro lenslet apertures in each element being axially aligned with the apertures in the remaining elements so that each set of axially aligned micro lenslet apertures form a micro lenslet of the Einzel type. The electron beam tube further includes an electron gun 12, a condenser lens assembly 13, the coarse deflector 14 and a termination plate 15 all located ahead of the objective lens assembly 11 relative to the electron beam originating at the electron gun 12. The micro deflector assembly 16 and a target element 17 are located on the electron beam exit side of the objective lens assembly 11.

For a more detailed description of the physical construction and operation of the elements 12-17 comprising the electron beam tube, reference is made to the above noted U.S. Pat. No. 4,142,132 and copending application Ser. No. 093,008, and to the prior art references cited therein and to U.S. application Ser. No. 958,657, filed Nov. 8, 1978. S. P. Newberry et al. Briefly, however, it should be noted that the electron beam produced by electron gun 12 is first focused by a condenser lens 13 and imaged upon the coarse deflector 14. Preferably, coarse deflector 14 comprises an eightfold coarse deflector of the type described and claimed in U.S. Pat. No. 4,142,132 and has coarse deflection potentials together with appropriate correction potentials supplied thereto for deflecting the electron beam to a desired one of the many micro lenslets formed by the axially aligned lens elements 11A, 11B and 11C of the objective lens assembly 11. The micro lenslets extend both vertically and horizontally in an X-Y plane so as to present a planar array of such micro lenslets with only one of the micro lenslets being accessed by coarse deflection of the electron beam at a given instant. The selected micro lenslet then serves to further finely focus the electron beam and image it upon a succeeding micro deflector element of the micro deflector assembly 16. Micro deflector 16 serves to deflect the finely focused electron beam again in an X-Y plane to cause it to impinge upon a selected point on the target plane 17. For definition purposes, it is assumed that the Y-axis accessed through the coarse and fine deflectors extends up and down the target element illustrated in FIG. 1, and the X-axis extends into and out of the plane of paper as viewed by the reader. It will be appreciated therefore that while the electron beam is deflected by coarse deflector 14 to any of the micro lenslets of objective lens micro assembly 11 other than the center micro lenslet, that such off-center micro lenslet lacks coaxial symmetry about the center axis of the overall objective lens assembly. The termination plate 15 intermediate the coarse deflector 14 and the objective lens micro assembly 11 serves to terminate any deflecting field produced by either coarse deflector 14 or micro lens 11 at this point along the axial length of the tube and thereby prevents interaction of such fields during operation of the tube. It is believed obvious to one skilled in the art that an additional field termination plate similar to 15 could be provided intermediate micro lens 11 and micro deflector 16. In most instances, however, the structures of micro lens 11 and micro deflector 16 are such that they do not require a separate termination plate between them to prevent undesired interaction of their respective fields on the operation of one or the other. This same characteristic can also be true of certain tube designs which do not require placement of a termination plate between the coarse deflector and the objective micro lens.

In order to operate as described briefly above, and as noted earlier, to achieve focus using the Einzel micro lens assembly 11 shown in FIG. 1, it is necessary to apply a high voltage energizing potential typically 5 kilovolts to the center element 11B of the assembly. To maintain focus on the stationary target plane 17 while the beam is deflected as described briefly above, it is further necessary to provide a dynamic correction to the focus voltage which is derived from the deflection voltages so that the focal plane of the deflected beam will fall as closely as possible onto a selected position on the target plane. For this purpose, a high voltage power supply 18 is provided along with dynamic focus correction potential source 19 with the dynamic focus correction potential being added to or otherwise modulated onto the high voltage supply potential through a summary amplifier 20 or other similar means. The problem with this prior art arrangement is that it is extremely difficult and expensive to implement circuitry for dynamically changing (correcting) the very precise, regulated high voltage supply potential for application to the center element 11B in this known manner.

The above-discussed electronic drive problem is circumvented in the present invention by applying the dynamic correction component of the focus voltage to a different element, preferably the entrance element 21A of the three axially aligned electrostatic lens elements 21A, 21B and 21C while applying the high voltage 4 kv excitation potential to the center element 21 of micro lens assembly 21 as shown in FIG. 2 of the drawings. Similar to FIG. 1, the electrostatic lens elements 21A–21C each have an array of micro lenslet apertures formed therein with each set of axially aligned micro lenslet apertures in the three lens elements forming a micro lenslet that is axially aligned with a corresponding micro deflector opening in the micro deflector assembly 16. The remaining outermost electrostatic lens element 21C which is closest to the target plane 17 is maintained at system ground reference potential. The important distinction is that the high voltage excitation potential $V_E$ from high voltage power supply 18 is applied to one of the lens elements 21B while the dynamic focus correction potential is separately applied to a different lens element 21A closest to electron gun 12. The outermost lens element 21C is maintained at system ground reference potential in order to terminate the electric field of the objective lens assembly 21. This approach is much more advantageous and preferred over the arrangement of FIG. 1 since it is relatively simple to design a low voltage (less than 250 volts) amplifier with a 1 megahertz band width for supplying the dynamic focus correction potential to lens element 21A, than it is to design a high voltage (4 kilovolts or greater) amplifier with a 1 megahertz band width as required for the system of FIG. 1.

While the system shown in FIG. 2 is greatly preferred because of its greater simplicity and lower cost, it has been determined that at reasonable deflections of the electron beam, the application of the dynamic focus correction potential to the entrance element 21A of the objective lens assembly 21, can introduce small aberrations and miscollimations to the beam. In addition, higher order position dependence of the defocus of the beam is not accounted for by the correction introduced by the dynamic focus correction potential alone. It has been determined further that it is possible to distribute these errors and reduce them to acceptable levels at all locations on the X-Y plane of the target element by offsetting the correction. This is achieved by introducing an offset term $\pm(V_{EOC}+V_{EOF})$ into the high voltage excitation potential $V_E$ so that a combined excitation and offset potential $V_E\pm(V_{EOC}+V_{EOF})$ is applied to the center element 21B of objective lens assembly 21. The offset voltage $\pm(V_{EOC}+V_{EOF})$ is supplied from an offset voltage source 23 and can be added to the high voltage excitation potential by a summing amplifier 24 as shown in FIG. 6. Since the offset voltage is essentially a constant term, no difficulty is experienced in either adding or subtracting this term to $V_E$ in order to derive the combined high voltage excitation and offset potential $V_E\pm(V_{EOC}+V_{EOF})$ that is applied to lens element 21B. The offset voltage $\pm(V_{EOC}+V_{EOF})$ is balanced by a constant term $\pm(v_{oc}+v_{of})$ that is added to the dynamic focus correction potential $V_{DF}$ supplied to the entrance element 21A. The constant term $\pm(v_{oc}+v_{of})$ is separately developed and is proportional to but not the same as the offset voltage $\pm(V_{EOC}+V_{EOF})$.

The dynamic focus correction potential $V_{DF}$ supplied to lens element 21A is given by the expression $V_{DF}=V_{CDF}+V_{FDF}$ where $V_{CDF}$ is the coarse deflection component of the dynamic focus voltage $V_{DF}$ and has the following functional form:

$$V_{CDF}=M_C(v_{cx}^2+v_{cy}^2)-v_{oc} \tag{1}$$

In equation (1) $v_{cx}$ and $v_{cy}$ are the coarse deflection voltages supplied to the coarse deflector of the electron beam tube, $M_C$ is a multiplication factor determined by the parameters of the coarse deflection section and $v_{oc}$ is the compensating offset voltage for the coarse deflection dynamic focus component.

$V_{FDF}$ is the fine deflection component of the dynamic focus correction voltage $V_{DF}$ and has the following functional form:

$$V_{FDF}=M_{fx}v_{fx}^2+M_{fy}v_{fy}^2-v_{of} \tag{2}$$

where $v_{fx}$ and $v_{fy}$ are the fine deflection voltages that are applied to the X and Y fine deflection system, $M_{fx}$ and $M_{fy}$ are the X and Y multiplication factors for the fine deflection system as determined by the design parameters of the fine deflection system and $v_{of}$ is the offset voltage component for the fine deflection component of the dynamic focus correction potential.

FIG. 3 of the drawings shows one alternative method and system for practicing the invention wherein the high voltage power supply potential $V_E$ and the offset voltage components $\pm(V_{EOC}+V_{EOF})$ from source 23 is supplied through summing amplifier 24 to the center element 21B of the three lens element Einzel lens assembly 21 similar to the FIG. 2 system. However, in the system of FIG. 3, the dynamic focus correction potential together with its two offset components $V_{DF}\pm(v_{oc}+v_{of})$ is supplied from source 22 to both of the outermost lens elements 21A and 21C. In this alternative system, termination of the objective micro lens field on the inlet side of the micro lens assembly is provided by termination plate 15 and termination of the micro lens field on the outlet side of the assembly is provided by the micro deflector assembly 16 whose design is such that interaction of the micro lens fields with the fine deflecting electrostatic fields of the micro deflector is avoided.

FIG. 4 of the drawings illustrates a still different method and system according to the invention where again the high voltage power supply potential and offset component $V_E \pm (V_{EOC} + V_{EOF})$ again is supplied to the center lens element 21A of the objective micro lens assembly 21. In the FIG. 4 system, however, the dynamic focus correction potential and offset components $V_{DF} \pm (v_{oc} + v_{of})$ are applied to the exit lens element 21C closest to the target plane 17 and the entrance lens element 21A closest to the electron gun 12 is maintained at system reference ground potential. In this arrangement, similar to that of FIG. 3, termination plate 15 terminates the objective micro lens field on the entrance side of the micro lens assembly, and the micro deflector 16 terminates the micro lens field on the exit side of the assembly.

Figure 5:
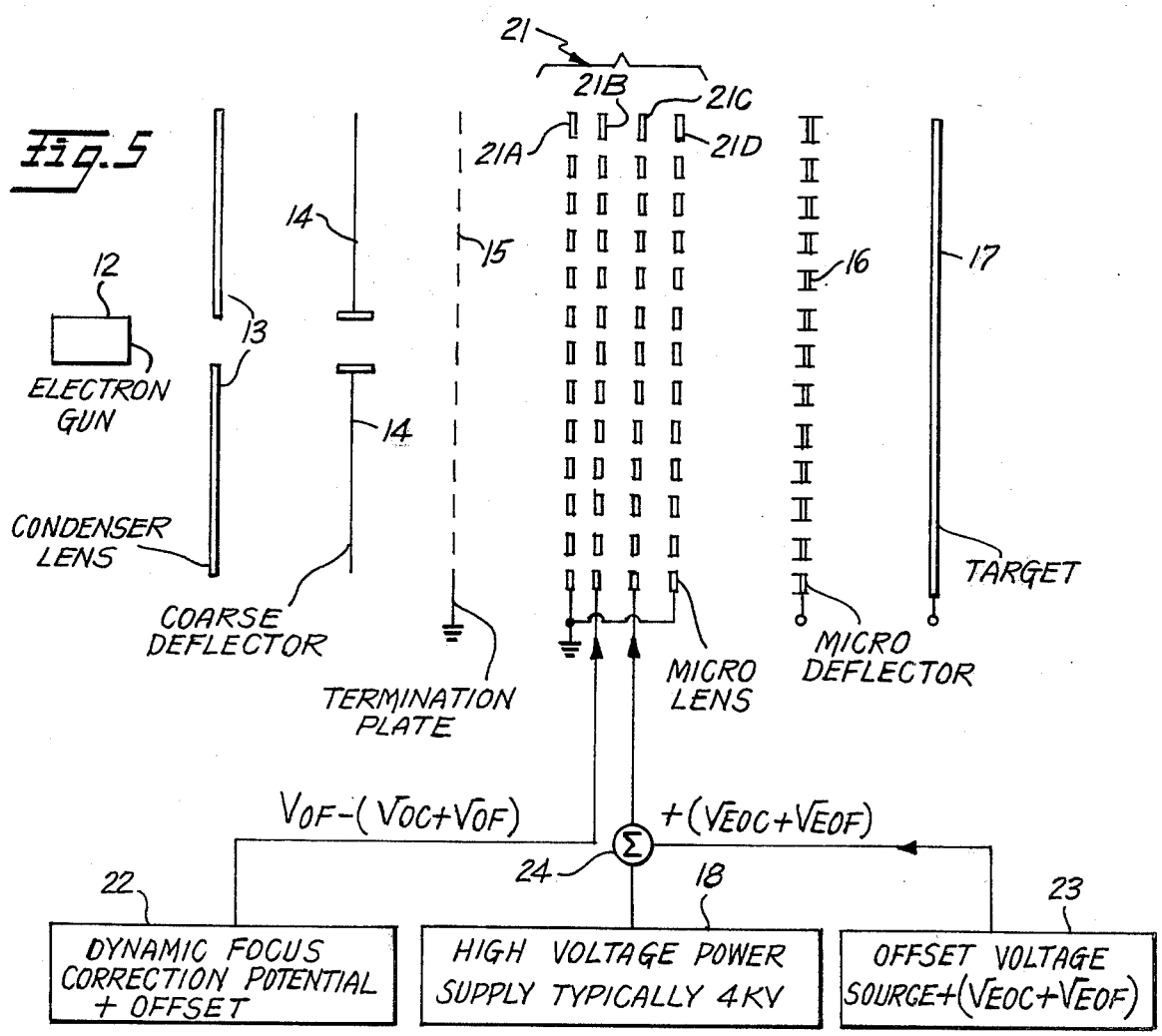
FIG. 5 is a partial schematic diagram similar to FIGS. 1-5 which illustrate a novel four element objective micro lens system constructed and operated according to the invention.

FIG. 5 illustrates still another alternative method and system according to the invention wherein the objective micro lens assembly 21 is comprised by four lens elements 21A–21D. In the alternative system of FIG. 5, the high voltage power supply potential and offset components $V_E \pm (V_{EOC} + V_{EOF})$, is supplied to one of the inner lens elements 21C which is closest to the target plane 17. The dynamic focus correction potential plus its offset component $V_{DF} \pm (v_{oc} + v_{of})$ is supplied to the remaining inner lens element 21B which is closest to the electron gun 12 and hence constitutes the entrance inner lens elements of the assembly while 21C constitutes the exit inner lens element. The remaining two outermost lens elements 21A and 21D are tied together electrically and maintained at system reference ground potential. With this arrangement, axial symmetry of the objective micro lens assembly electrostatic field is assured. The termination plate 15 also is employed primarily to assure termination of the coarse deflector 14 electrostatic field in the axial direction of the objective micro lens assembly 21.

In operation, the alternative systems shown in FIGS. 3, 4 and 5 function in essentially the same manner as was described with reference to the system of FIG. 2, and provide the same constructional advantages as the system of FIG. 2 in that with each of the alternative systems, it is not necessary to modulate or otherwise combine a dynamic focus correction potential with the high voltage excitation power supplied to the objective micro lens assembly. The system of FIG. 2 is preferred, and is considered to be the best mode of practicing the invention at the time of filing the application due to the fact that it can be practiced without requiring additional lens elements, and yet provides all of the advantages obtained by separately supplying the high voltage excitation power to one lens element and the dynamic focus correction potential to a separate lens element while at the same time obtaining an essentially symmetrically axial objective micro lens field by reason of the presence of the termination plate 15 and the grounded exit lens element 21C.

FIG. 7 of the drawings is a functional block diagram of a dynamic focus correction potential generator suitable for use in deriving the dynamic focus correction potential from both the fine deflection voltages and the coarse deflection voltages supplied to the beam tube and to provide the necessary offsets as discussed in the preceding paragraphs. The dynamic focus correction potential generator 22 is comprised by a pair of input multiplier amplifiers 111 and 112 of conventional, commercially available, integrated circuit construction. The $v_{FX}$ low level fine deflection voltage is supplied to the input of multiplier 111 for multiplication by itself to derive at the output of of multiplier 111 a signal $v_{FX}^2$. Similarly, the low level fine deflection voltage $v_{FY}$ is supplied to the input of the multiplier 112 for multiplication by itself to derive at the output of multiplier 112 a signal $v_{FY}^2$. An operational amplifier 113 of conventional, commercial construction is provided having a transfer function $C_{F2}A_{DFX}$ and is connected to the output of multiplier 111 for deriving at its output a signal $C_{F2}A_{DFX}v_{FX}^2$ where the value $C_{F2}$ is a scaling factor having the value $G_F^2/V_C$ with $G_F$ being the fine deflection amplifier gain and the potential $-V_C$ being equal to the cathode voltage relative to system ground reference potential. The term $A_{DFX}$ is a constant determined by the design parameters of the fine X deflection system as explained more fully in U.S. Pat. No. 4,142,132. It should be further noted that the term $A_{DFX}/V_C = M_{fx}$ is the X multiplication factor in equation (2) set forth above. The multiplier 112 has its output supplied through an operational amplifier 114 that is similar in construction to amplfier 113 but has the transfer function $C_{F2}A_{DFY}$ and derives at its output a signal $C_{F2} \cdot A_{DFY} v_{FY}^2$. The constant $A_{DFY}$ is a constant determined by the parameters of the fine Y deflection system and $C_{F2} \cdot A_{DFY}/V_C = M_{fy}$ the Y multiplication factor in equation (2). The outputs of the multiplier circuits 113 and 114 are supplied to a summing amplifier 116 of conventional, commercially available construction which derives at its output a dynamic fine correction potential $V_{FDF} = C_{F2}(A_{DFX} \cdot v_{FX}^2 + A_{DFY} \cdot v_{FY}^2 = A_{DFX} \cdot V_{FX}^2 + A_{DFY} \cdot V_{FY}^2)/V_C = M_{fx}V_{FX}^2 + M_{fy}V_{FY}^2$ where $V_{FX} = G_F v_{FX}$ and $V_{FY} = G_F v_{FY}$ are the X and Y fine deflection plate voltages, respectively, and where $V_{FDF}$ is the dynamic focus correction potential component derived from the fine deflected voltages.

The coarse deflection potentials $v_X$ and $v_Y$ are supplied to respective multiplier amplifiers 111C, 112C, and through operational amplifiers 113C and 114C, respectively to a second summing amplifier 116C. The multipliers 111C, 112C, operational amplifiers 113C and 114C and summing amplifier 116C all are similar in construction and operation to the correspondingly numbered elements described in relation to the fine deflection channel, but which instead operate on the coarse deflection voltages $v_X$ and $v_Y$. At the output of the summing amplifier 116C, a coarse dynamically corrected focus potential $V_{CDF}$ is derived which is equal to $C_2 A_{DF}(v_X^2 + v_Y^2) = A_{DF}(V_X^2 + V_Y^2)/V_C = M_c(V_X^2 + V_Y^2) = V_{CDF}$ where $C_2$ is a scaling factor having a value $G^2/V_C$ with V being equal to the coarse deflection amplifier gain, $A_{DF}$ is a constant determined by the coarse deflection amplifier parameters, $M_c$ is the multiplication factor for the coarse deflection system employed in equation (1) above and is equal to $A_{DF}/V_C$ and $V_X = G \cdot v_X$ and $V_Y = G \cdot v_Y$ are the coarse X and Y deflection plate voltages, respectively. The constant $A_{DF}/V_C = M_c$ as well as the multiplication factors $M_{fx}$ and $M_{fy}$ can be determined either empirically or by computer simulation.

The fine dynamic focus correction component $V_{FDF}$ derived at the output of summing amplifier 116 and the coarse dynamic focus correction component $V_{CDF}$ derived at the output of summing amplifier 116C, are supplied as inputs to a third summing amplifier 117 which derives at its output the dynamic focus correction potential $V_{DF} = V_{CDF} + V_{FDF}$. This dynamic focus correction potential is then supplied to a fourth summing amplifier 118 along with a compensating offset potential $-(v_{oc} + v_{of})$ to derive at the output of amplifier 118 the combined dynamic focus potential plus compensating offset given by $V_{DF} - (v_{oc} + v_{of})$ that then is supplied to the entrance inner lens element 21B as shown in FIG. 2. The compensating offset voltage source supplying the compensating offset term $-(v_{oc}+v_{of})$ suitably may comprise a potentiometer and the offset voltage source 23 employed to develop the offset voltage $+(-v_{oc}+v_{of})$ likewise may comprise a potentiometer having its output added to the output from the high voltage power supply 18.

From the foregoing description it will be appreciated that the invention provides a relatively simple, low cost and reliable method and means for applying the dynamic component of a focus potential to an objective lens assembly used in EBAM and/or EBAL tubes and demountable columns of the compound fly's eye type having both coarse and fine deflection sections. The invention accomplishes this simplification in construction and reduction is cost while at the same time reducing to a minimum electron beam abberations and beam astigmatism at the target plane. As noted above, the system is particularly suitable for use with evacuated electron beam tubes or demountable continuously evacuated electron beam columns of the two-stage, compound fly's eye type wherein a two-stage eight-fold electrostatic coarse deflector system is employed in conjunction with a fly's eye, objective micro lens assembly and micro deflector section in a single evacuated tube or a continuously evacuated column structure. It should be noted, however, that the invention is not restricted in its application to use with electron beam tubes but may be used with other charged particle beam tubes or columns which employ electrostatic objective lens assemblies requiring dynamic focus correction.

Having described several embodiments of a new and improved electron beam charged particle apparatus and improved method of operation according to the invention, it is believed obvious that other modifications and variations of the invention will be suggested to those skilled in the art in the light of the above teachings. It is therefore to be understood that changes may be made in the particular embodiments of the invention described which are within the fully intended scope of the invention as defined by the appended claims.

We claim:

1. A unipotential electrostatic lens for charged particle beam tubes of the electron beam type which may lack coaxial symmetry about the lens axis, said unipotential lens comprising an assembly of axially aligned electrostatic lens elements wherein each lens element has an array of micro lenslet apertures formed therein and with each set of axially aligned micro lenslet apertures in the assembly forming a micro lenslet, means for applying a high voltage excitation potential to one of the electrostatic lens elements, and means for applying a dynamic focus correction potential derived from deflection potentials applied to the charged particle tube to a different electrostatic lens element of the axially aligned assembly from that to which the high voltage excitation potential is applied.

2. A unipotential electrostatic lens according to claim 1 wherein there are three lens elements in the axially aligned assembly, the high voltage excitation potential is applied to the center lens element, the dynamic focus correction potential is applied to at least one of the outer lens elements.

3. A unipotential electrostatic lens according to claim 2 wherein the dynamic focus correction potential is applied to the outer one of the three axially aligned lens element that is designed to be closest to a charged particle beam source for a charged particle beam tube with which the lens is used, and the remaining outer lens element that is designed to be furthest from the charged particle beam source is maintained at system ground reference potential level.

4. A unipotential electrostatic lens according to claim 2 wherein the outer lens element that is designed to be closest to a charged particle beam source for a charged particle beam tube with which the lens is used, is maintained at system ground reference potential level, and the dynamic focus correction potential is applied to the remaining outer lens element designed to be furthest from the charged particle beam source.

5. A unipotential electrostatic lens according to claim 2 wherein the high voltage excitation potential is applied to the center lens element and the dynamic focus correction potential is applied to the two outer lens elements.

6. A unipotential electrostatic lens according to claim 1 wherein the assembly of electrostatic lens elements is comprised by four lens elements with the two outermost lens elements being maintained at system ground reference potential, the inner lens element of the assembly closest to the charged particle beam source and hence the first inner lens element traversed by the charged particle beam has the dynamic focus correction potential applied thereto, and the remaining inner lens element has the high voltage excitation potential applied thereto.

7. A unipotential electrostatic lens according to either claim 1, claim 2, claim 5 or claim 6, wherein the lens is employed in a charged particle beam tube of the compound fly's eye type having both a coarse deflection system and a fine deflection system and the dynamic focus correction potential $V_{DF}$ is derived from both the coarse and fine deflection potentials in accordance with the expression $V_{DF}=V_{CDF}-V_{FDF}$ where $V_{CDF}$ is the coarse deflection component of the dynamic focus correction potential and $V_{CDF}=M_C(v_X^2+v_Y^2)$ with $v_X$ and $v_Y$ the coarse X and Y deflection voltages, respectively, and $M_C$ is a multiplication factor for CDF determined by coarse deflection system design parameters and wherein $V_{FDF}$ is the fine deflection component and $V_{FDF}=M_{fX}v_{FX}^2+M_{fY}v_{FY}^2$ with $v_{FX}$ and $v_{FY}$ being the fine X and Y deflection voltages and $M_{fX}$ and $M_{fY}$ being the X and Y multiplication factors for FDF and are determined by the fine deflection system design parameters.

8. A unipotential electrostatic lens according to claim 2 further including means for supplying a fixed offset potential that is added to the high voltage excitation potential applied to the center electrostatic lens elements, and means for supplying a compensating offset potential that is added to the dynamic focusing correction potential applied to at least one of the outer electrostatic lens elements to thereby distribute and minimize the effect of deflection sweep and astigmatism errors that otherwise might be introduced by the uncompensated dynamic focus correction potential alone.

9. A unipotential electrostatic lens according to claim 8 wherein the assembly of electrostatic lens elements is comprised by three lens elements with the center lens elements having the high voltage excitation potential applied thereto together with a fixed offset potential, the outer lens element of the assembly closest to the charged particle beam source and hence the first lens element traversed by the charged particle beam has the dynamic focus correction potential together with the compensating offset potential applied thereto, and the remaining outer lens element is maintained at system ground reference potential level.

10. A unipotential electrostatic lens according to claim 9 wherein the lens is employed in a charged particle beam tube of the compound fly's eye type having both a coarse deflection system and a fine deflection system and the dynamic focus correction potential $V_{DF}$ together with the coarse and fine component of the compensating offset potential is derived from both the coarse and fine deflection potentials in accordance with the expression $V_{DF}-(v_{of}+v_{oc})=V_{CDF}-V_{oc}+V_{FDF}-v_{of}$ where $V_{CDF}$ is the coarse deflection component of the compensating offset potential and $V_{CDF}-v_{oc}=M_C(v_X{}^2+v_Y{}^2)-v_{oc}$ with $v_X$ and $v_Y$ the coarse X and Y deflection voltages, respectively, $M_C$ is a multiplication factor for CDF determined by coarse deflection system design parameters; and $V_{FDF}-v_{of}$ is the fine deflection component together with the fine component $v_{of}$ of the compensating offset potential where $V_{FDF}-v_{of}=M_{fX}v_{FX}{}^2+M_{fY}v_{FY}{}^2-v_{of}$ with $v_{FX}$ and $v_{fy}$ the fine X and Y deflection voltages, $M_{fX}$ and $M_{fY}$ are the X and Y multiplication factors for FDF as determined by the fine deflection system design parameters.

11. A unipotential electrostatic lens according to claim 2, claim 5 or claim 6, further including means for supplying a fixed offset potential that is added to the high voltage excitation potential applied to the center electrostatic lens elements, and means for supplying a compensating offset potential that is added to the dynamic focusing correction potential applied to at least one of the outer electrostatic lens elements to thereby distribute and minimize the effect of deflection sweep and astigmatism errors that otherwise might be introduced by the uncompensated dynamic focus correction potential alone.

12. The method of operating an objective lens assembly for charged particle beam tubes of the electron beam type which may lack coaxial symmetry about the lens axis and wherein the objective lens assembly comprises a plurality of at least three electrostatic lens elements axially aligned along the charged particle beam path with each lens element having an array of micro lenslet apertures formed therein and with each set of axially aligned micro lenslet apertures forming a micro lenslet; said method comprising applying a high voltage excitation potential to a center one of the electrostatic lens elements, and applying a dynamic focus correction potential derived from deflection potentials supplied to a charged particle tube with which the objective lens assembly is used to a different electrostatic lens element of the axially aligned assembly from that to which the high voltage excitation potential is applied.

13. The method according to claim 12, wherein a fixed offset potential is added to the high voltage excitation potential and a compensating offset potential is added to the dynamic focus correction potential in order to distribute and minimize the effect of deflection sweep and astigmatism errors that otherwise might be introduced by the uncompensated dynamic focus correction potential alone.

14. The method of operating an objective lens assembly for charged particle beam tubes of the electron beam type which may lack coaxial symmetry about the lens axis, wherein the objective lens assembly comprises three electrostatic lens elements axially aligned along the charged particle path with each lens element having an array of micro lenslet apertures formed therein and with each set of axially aligned micro lenslet apertures forming a micro lenslet; said method comprising maintaining one of the outer electrostatic lens elements of the axially aligned assembly at a system ground reference potential level, applying a high voltage excitation potential to the center electrostatic lens element, and applying a dynamic focus correction potential derived from the deflection potentials supplied to the charged particle tube with which the objective lens assembly is used to the remaining outer electrostatic lens element of the axially aligned assembly.

15. The method according to claim 14 wherein a fixed offset potential is added to the high voltage excitation potential and a compensating offset potential is added to the dynamic focus correction potential in order to distribute and minimize the effect of deflection sweep and astigmatism errors that otherwise might be introduced by the uncompensated dynamic focus correction potential alone.

16. The method according to claim 13 or claim 15 wherein the objective lens assembly comprises the objective lens of a charged particle tube of the compound fly's eye type having both a coarse deflection system and a fine deflection system and the dynamic focus correction potential $V_{DF}$ together with compensation offset voltage components is derived from both the coarse and fine deflection potentials in accordance with the expression $$V_{DF}-(v_{of}+v_{oc})=V_{CDF}-v_{oc}+V_{FDF}-v_{of}$$

where $V_{CDF}$ is the coarse deflection component of the dynamic focus correction potential and $$V_{CDF}-v_{oc}=M_C(v_X{}^2+v_Y{}^2)-v_{oc}$$

with $v_X$ and $v_Y$ the coarse X and Y deflection voltages, respectively, $M_C$ is the multiplication factor for CDF determined by the coarse deflection system design parameters, and $-v_{oc}$ is an offset voltage component associated with the coarse deflection voltages, and where $V_{FDF}$ is the fine deflection component and $$V_{FDF}=M_{fX}v_{FX}{}^2+M_{fY}v_{FY}{}^2-v_{of}$$

with $v_{FX}$ and $v_{FY}$ the fine X and Y deflection voltages, $M_{fX}$ and $M_{fY}$ are the X and Y multiplication factors for FDF determined by the fine deflection system design parameters, and $v_{of}$ is an offset voltage component associated with the fine deflection voltages.

17. In an electron beam tube of the compound fly's eye type having a coarse deflector and a fine deflector following the coarse deflector, an electron gun, a condenser lens disposed between the electron gun and the coarse deflector, an objective lens disposed between the coarse deflector and the fine deflector and a target member following the fine deflector all within an evacuated tube or continuously evacuated demountable column; the improvement wherein said objective lens comprises a unipotential lens assembly formed by a plurality of at least three axially aligned electrostatic lens elements with each lens element having an array of micro lenslet apertures formed therein and with each set of axially aligned micro lenslet apertures forming a micro lenslet, means for applying a high voltage excitation potential to at least one inner electrostatic lens element located between and bounded by the two outermost lens elements, and means for applying a dynamic focus correction potential derived from the coarse and fine deflection potentials supplied to the coarse and fine deflectors to a different electrostatic lens element of the axially aligned assembly which is separate from that to which the high voltage excitation potential is applied and which is not maintained at system ground reference potential level.

18. An electron beam tube according to claim 17 wherein the axially aligned assembly of lens elements is comprised by three lens elements, the dynamic focus correction potential is applied to the first outer lens element traversed by the electron beam, the high voltage excitation potential is applied to the center lens element and the remaining outer lens element is maintained at system ground reference potential level.

19. An electron beam tube according to claim 17 wherein the assembly of electrostatic lens elements is comprised by four lens elements with the two outermost lens elements being maintained at system ground reference potential level, the lens element of the assembly closest to the electron gun and hence the first inner lens element traversed by the electron beam having the dynamic focus correction potential applied thereto, and the remaining inner lens element having the high voltage excitation potential applied thereto.

20. An electron beam tube according to claim 18 or claim 19 wherein the dynamic focus correction potential is derived from both the coarse and fine deflection potentials in accordance with the expression $V_{CF}=V_{CDF}+V_{FDF}$ where $V_{CDF}$ is the coarse deflection component of the dynamic focus correction potential and $V_{CDF}=M_C(v_X^2+v_Y^2)$ with $v_X$ and $v_Y$ the coarse X and Y deflection voltages, respectively, and $M_C$ is the multiplication factor for CDF determined by coarse deflection system design parameters and where $V_{FDF}$ is the fine deflection component and $V_{FDF}=M_{fx}v_{fx}^2+M_{fy}v_{fy}^2$ with $v_{FX}$ and $v_{FY}$ the fine X and Y deflection voltages and $M_{fX}$ and $M_{fY}$ are the X and Y multiplication factors for FDF and are determined by the fine deflection system design parameters.

21. An electron beam tube according to claim 17 further including means for supplying a fixed offset potential that is added to the high voltage excitation potential applied to one of the electrostatic lens elements, and means for supplying a compensating offset potential that is added to the dynamic focusing correction potential applied to a different electrostatic lens element to thereby distribute and minimize the effect of deflection sweep and astigmatism errors that otherwise might be introduced by the uncompensated dynamic focus correction potential alone.

22. An electron beam tube according to claim 18 further including means for supplying a fixed offset potential that is added to the high voltage excitation potential applied to one of the electrostatic lens elements, and means for supplying a compensating offset potential that is added to the dynamic focusing correction potential applied to a different electrostatic lens element to thereby distribute and minimize the effect of deflection sweep and astigmatism erros that otherwise might be introduced by the uncompensated dynamic focus correction potential alone.

23. An electron beam tube according to claim 19 further including means for supplying a fixed offset potential that is added to the high voltage excitation potential applied to one of the electrostatic lens elements, and means for supplying a compensating offset potential that is added to the dynamic focusing correction potential applied to a different electrostatic lens element to thereby distribute and minimize the effect of deflection sweep and astigmatism erros that otherwise might be introduced by the uncompensated dynamic focus correction potential alone.

24. An electron beam tube according to claim 21, claim 22 or claim 23 wherein the dynamic focus correction potential $V_{DF}$ together with the coarse and fine component of the compensating offset potential is derived from both the coarse and fine deflection potentials in accordance with the expression $$V_{DF}-(v_{of}+v_{oc})=V_{CDF}-v_{oc}+V_{FDF}-v_{of}$$

where $V_{CDF}$ is the coarse deflection component of the dynamic focus correction potential and $-v_{oc}$ is the coarse component of the compensating offset potential and $$V_{CDF}-v_{oc}=M_C(v_X^2+v_Y^2)-v_{oc}$$

with $v_X$ and $v_Y$ the coarse X and Y deflection voltages, respectively, and $M_C$ is a multiplication factor for CDF determined by coarse deflection system design parameters; and $V_{FDF}-v_{of}$ is the fine deflection component together with the fine component of the compensating offset potential where $$V_{FDF}-v_{of}=M_{fX}v_{FX}^2+M_{fy}v_{FY}^2-v_{of}$$

with $v_{FX}$ and $v_{FY}$ the fine X and Y deflection voltages and $M_{fX}$ and $M_{fY}$ are the X and Y multiplication factors for FDF as determined by the fine deflection system design parameters.

* * * * *